US007881089B2

(12) United States Patent
Franceschini et al.

(10) Patent No.: US 7,881,089 B2
(45) Date of Patent: Feb. 1, 2011

(54) CODING TECHNIQUES FOR IMPROVING THE SENSE MARGIN IN CONTENT ADDRESSABLE MEMORIES

(75) Inventors: Michele M. Franceschini, White Plains, NY (US); Chung H. Lam, Peekskill, NY (US); Luis A. Lastras, Cortlandt Manor, NY (US); Bipin Rajendran, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 157 days.

(21) Appl. No.: 12/392,049

(22) Filed: Feb. 24, 2009

(65) Prior Publication Data

US 2010/0214811 A1    Aug. 26, 2010

(51) Int. Cl.
*G11C 15/00* (2006.01)
(52) U.S. Cl. .................................. 365/49.17; 365/49.1
(58) Field of Classification Search .............. 365/49.17, 365/49.1
See application file for complete search history.

(56) References Cited

U.S. PATENT DOCUMENTS

| 7,050,316 | B1 | 5/2006 | Lin et al. ..................... 365/49 |
| 7,227,765 | B2 | 6/2007 | De Sandre et al. ............ 365/49 |
| 7,711,893 | B1 * | 5/2010 | Venkatachary .............. 711/108 |
| 2007/0097740 | A1 | 5/2007 | Derhacobian et al. ........ 365/163 |
| 2008/0068872 | A1 | 3/2008 | Lee et al. ................. 365/49.17 |

FOREIGN PATENT DOCUMENTS

| EP | 0230304 | 7/1987 |
| EP | 1 526 547 A1 | 4/2005 |
| WO | WO 2007/005067 | 1/2007 |

OTHER PUBLICATIONS

D. L. Cohn et al., "A Code Separation Property" IRE Transactions on Information Theory, pp. 382-388 (1962).
J. M. Berger "A Note on Error Detection Codes for Asymmetric Channels" Information and Control 4, 68-73 (1961).
Kostas Pagiamtzis et al., "A Soft-Error Tolerant Content-Addressable Memory (CAM) Using an Error-Correcting-Match Scheme" CICC (2006).
M. Y. Hsiau "On Calling Station Codes" IEEE Transactions on Information Theory, pp. 736-737 (1969).
Donald T. Tang et al., "Distance-2 Cyclic Chaining of Constant-Weight Codes" IEEE Transactions on Computers, vol. C-22, No. 2 (1973).

(Continued)

*Primary Examiner*—Son Dinh
*Assistant Examiner*—Nam Nguyen
(74) *Attorney, Agent, or Firm*—Ido Tuchman; Brian Verminski

(57) ABSTRACT

A content addressable memory using encoded data words and search words, and techniques for operating such device. In one embodiment, the data word is transformed into a code word guaranteeing a mismatch of at least two code word bits of different binary values during the memory search operation when the data word does not match a search word. In another embodiment, the search word is transformed into a search code such that the Hamming distance between the code word and the search code is greater than a given threshold when there is a mismatch of at least one bit between the data word and the search word.

25 Claims, 5 Drawing Sheets

OTHER PUBLICATIONS

Thomas M. Cover, "Enmerative Source Encoding" IEEE Transactions on Information Theory, vol. IT-19, No. 1, pp. 73-77 (1973).
"Bounds on the size of a code" Ch. 17, §2, pp. 524-527.
C. V. Freiman "Optimal Error Detection Codes for Completely Asymmetric Binary Channels" Information and Control 5, 64-71 (1962).
K. Pagiamtzis, A. Sheikholeslami, "Content-Addressable Memory (CAM) Circuits and Architectures: A Tutorial and Survey",IEEE Journal of Solid-State Circuits, 41(3):712-727, Mar. 2006.
S.C. Krishnan, R. Panigrahy, S. Parthasarathy, "Error-correcting codes for ternary content addressable memories", IEEE Trans. Computers, 2009, vol. 58, No. 2, pp. 275-279.
C.-S. Lin, J.-C. Chang, and B.-D. Liu, "Design for low-power, low-cost, and high-reliability precomputation-based content-addressable memory," in Proc. Asia-Pacific Conf. Circuits Syst., vol. 2, 2002, pp. 319-324.
J. Gorman D. Cohn, "A code separation property", IRE Transactions on Information Theory, 8:382-383, 1962.
D.H. Lehner. Teaching combinatorial tricks to a computer. Proc. Symp. Applied Mathematics, 10, 1960.
E. Sperner. Ein Satz uber Untermengen ner endlichen Menge. Mathematische Zeitschrift, 27:544-548, 1928.
M. Blaum, editor. Codes for Detecting and Correcting Unidirectional Errors. IEEE Computer Soc. Press, Los Alamitos, CA, 1993.

* cited by examiner

CODING TECHNIQUES FOR IMPROVING THE SENSE MARGIN IN CONTENT ADDRESSABLE MEMORIES

BACKGROUND OF THE INVENTION

1. Field of the Invention

The present invention relates to content addressable memory, and more specifically to encoding techniques for storing and searching data in content addressable memory utilizing resistive memory elements.

2. Description of Background

Content addressable memory (CAM) is a type of computer memory utilized in high speed searching applications. Most CAM devices utilize transistors configured as static random access memory (SRAM), and additional transistor circuits for match operations. Typically in these CAM devices search line access transistors and word line access transistors are necessary to operate and program individual memory cells in the memory arrays. The search line access transistors and word line access transistors are often comprised of power intensive large drive field effect transistors (FET).

Phase change material can also be utilized to store information in CAM devices. Phase change materials can be manipulated into different phases or states, with each phase representing a different data value. Generally, each phase exhibits different electrical properties. The amorphous and crystalline phases are typically two phases used for binary data storage (1's and 0's) since they have detectable differences in electrical resistance. Specifically, the amorphous phase has a higher resistance than the crystalline phase.

One difficulty in using resistive memory elements, such as phase change memory, in CAM designs is the small sense margin when large data words are stored and searched in CAM. A single mismatching bit between a stored data word and a search word may not cause sufficient match current deviation to be detected. Conventional CAM designs with resistive memory cells are thus limited in the number of bits per stored word. The present invention addresses this limitation and other shortcomings of CAMs employing resistive memory elements.

SUMMARY OF THE INVENTION

One aspect of the invention is a method for operating content addressable memory. The method includes a providing a plurality of memory cells in parallel circuit. The memory cells are electrically coupled to a match line, and the match line is configured to receive a collective current from the memory cells during a memory search operation. A receiving operation receives a data word of bit length L for storage in the memory cells. A transforming operation transforms the data word into a code word of bit length greater than L such that at least one bit of the code word depends on at least two bits of the data word. The code word guarantees a mismatch of at least two code word bits of different binary values during the memory search operation when the data word does not match a search word. A storing operation stores the code word in the memory cells.

Another method for operating content addressable memory contemplated by the present invention includes providing a plurality of memory cells in parallel circuit and electrically coupled to a match line. The match line is configured to receive a collective current from the memory cells during a memory search operation. A receiving operation receives a data word of bit length L for storage in the memory cells. A transforming operation transforms the data word into a code word of bit length M, where M is greater than L. The transforming operation ensures that at least one bit of the code word depends on at least two bits of the data word. A storing operation stores the code word in the memory cells. Another receiving operation receives a search word of bit length L for comparison against the data word during the memory search operation. A second transforming operation transforms the search word into a search code of bit length M such that the Hamming distance between the code word and the search code is greater than a given threshold when there is a mismatch of at least one bit between the data word and the search word.

A further aspect of the present invention is a content addressable memory device. The device includes a plurality of memory cells in parallel circuit. The memory cells are electrically coupled to a match line, and the match line is configured to receive a collective current from the memory cells during a search operation. A receiving unit is configured to receive a data word of length L. An encoding unit is configured to transform the data word into a code word of length greater than L for storage in the memory cells; the transformation is such that at least one bit of the code word depends on at least two bits of the data word. The code word guarantees a mismatch of at least two code word bits of different binary values during the memory search operation when the data word does not match a search word.

Yet another aspect of the invention is a content addressable memory device. The device includes a plurality of memory cells in parallel circuit. The memory cells are electrically coupled to a match line, and the match line is configured to receive a collective current from the memory cells during a search operation. A receiving unit is configured to receive a data word of length L. An encoding unit is configured to transform the data word into a code word of length greater than L for storage in the memory cells. The transformation is such that at least one bit of the code word depends on at least two bits of the data word. The code word is configured to increase the current passing through the match line during the memory search operation when the data word does not match a search word.

An additional aspect of the invention is a computer program embodied in tangible memory. Program codes are coupled to the tangible memory for operating computer memory, and the computer memory includes a plurality of memory cells in parallel circuit. The memory cells are electrically coupled to a match line, and the match line is configured to receive a collective current from the memory cells during a memory search operation. The computer readable program codes are configured to cause the computer program to receive a data word of bit length L for storage in the memory cells; transform the data word into a code word of length greater than L such that at least one bit of the code word depends on at least two bits of the data word, the code word guaranteeing a mismatch of at least two code word bits of different binary values during the memory search operation when the data word does not match a search word; and store the code word in the memory cells.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

The present invention is described with reference to embodiments of the invention. Throughout the description of the invention reference is made to FIGS. 1-5.

Figure 1:
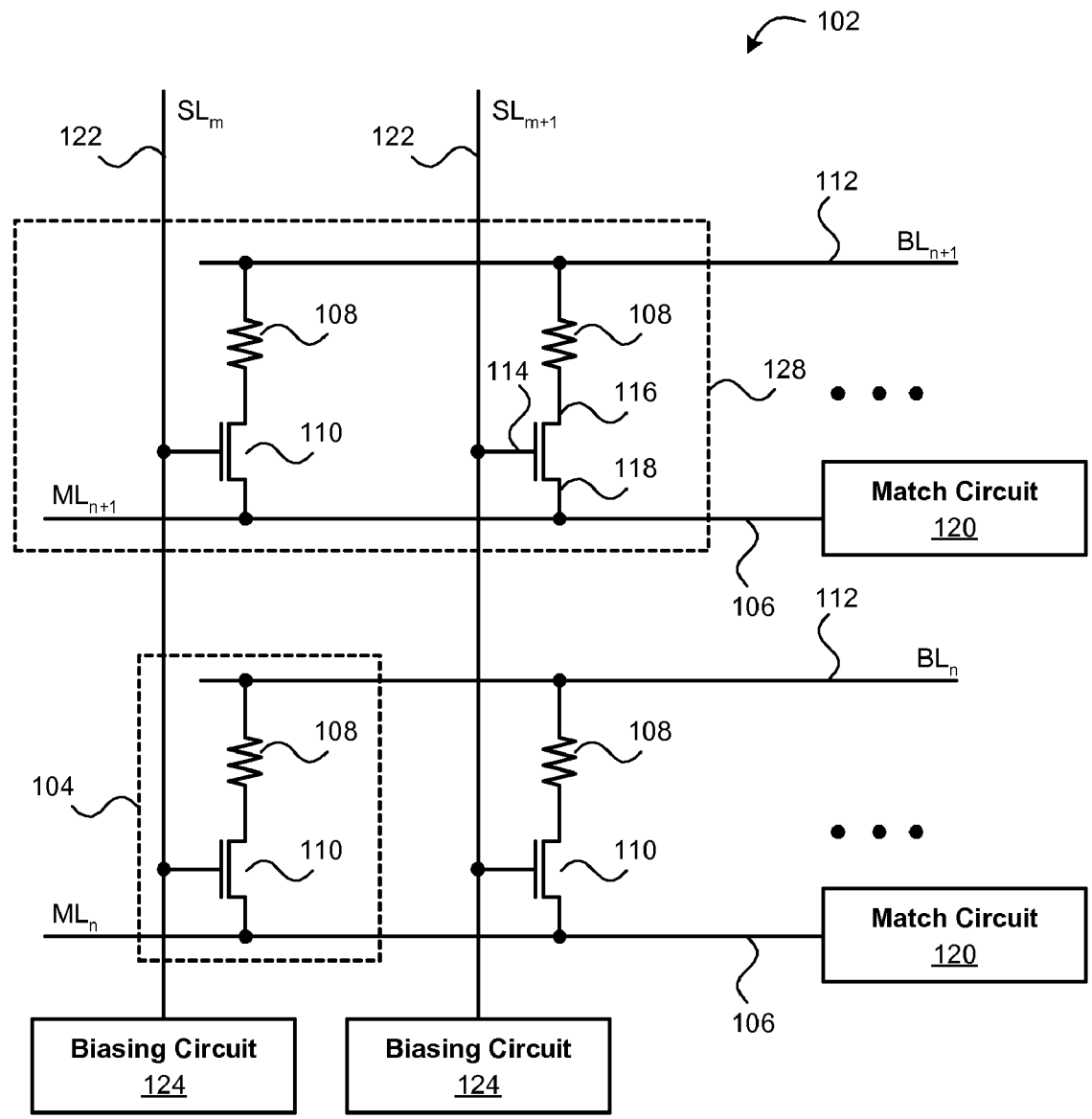
FIG. 1 illustrates one embodiment of a memory device contemplated by the present invention.

FIG. 1 shows an example of a content addressable memory (CAM) 102 contemplated by the present invention. The CAM 102 includes a plurality of memory cells 104 in a memory array. Each individual memory cell 104 includes a memory element 108 electrically coupled to an access device 110 in series circuit.

In an embodiment of the invention, the memory element 108 of the memory cell 104 is comprised of a phase change material capable of storing one of two resistances. An example of such phase change material is Germanium-Antimony-Tellurium (GST). Thus, the memory element may be programmed to one of two states: a crystalline state or an amorphous state.

The crystalline state may represent a stored binary 0 value and the amorphous state may represent a stored binary 1 value. In the crystalline state, the memory element exhibits a relatively low resistance (i.e., 5K ohms). On the other hand, in the amorphous state, the memory element has a relatively high resistance (i.e., 500K ohms). Those skilled in the art will recognize that a variety of storage technologies may be utilized for the memory element 108 and the example of phase change material is merely illustrative. For example, the memory element 108 may be comprised of a floating gate transistor, a resistive memory element, Magnetoresistive Random Access Memory (MRAM), or a charge trapping device.

In phase change memory, altering a memory element's state requires heating the material to a melting point and then cooling the material to one of the possible states. A current passed through the memory element creates ohmic heating and causes the phase change material to melt. Melting and gradually cooling down the phase change material in the memory element allows time for the phase change material to form in the crystalline state. Melting and abruptly cooling the phase change material in the memory element quenches the phase change material into the amorphous state.

The access device 110 includes a common terminal 114 controlling a current flow between a first terminal 116 and a second terminal 118. The common terminal is coupled to a search line 122, which controls the current flow through the memory element 108. The first terminal 116 of the access device 110 is electrically coupled to the memory element 108. In particular embodiments of the invention, the access devices 110 may be metal-oxide semiconductor field-effect transistors (MOSFET), bipolar junction transistors (BJT) and diodes. It is contemplated that other access devices may be used without departing from the spirit and scope of the invention.

As shown, the memory element 108 is electrically coupled to a bit line 112. Those skilled in the art will appreciate that the bit line 112 can be used to both program the memory element 108 to a desired state and to read the state of the memory element 108. For example, during programming, a high current is passed through the bit line 112 and into the memory element 108, thus causing the phase change material to melt from ohmic heating. During memory search operation, a low current is passed through the bit line 112 and into the memory element 108. The search operation current is insufficient to melt the phase change material, but large enough to detect the voltage drop across the memory element 108.

The second terminal 116 of the access device 110 is electrically coupled to a match line 106. During programming, the match line 106 acts to sink (or source) the relatively high current passing through the memory element 108, thereby causing the phase change material to melt. During a memory search operation, the match line 106 passes the current through the memory element 108 to a match circuit 120.

Groups of memory cells 104 are wired together as words 128. Each word 128 comprises memory cells 104 configured in parallel circuit between a bit line 112 and a match line 106. Thus, programming a particular word 128 requires energizing the appropriate bit line 112 and match line 106 pair.

Programming operations of the memory device 102 involve receiving a data word from a CPU or other external source. As discussed in detail below, the data word is transformed into a coded word stored in a particular word 128 of the memory array. Each bit of the coded word is stored in a single memory cell 104. The biasing circuit 124 biases the access device 110 by applying a pre-determined signal sufficient to program the code word bit in the memory element.

For example, for phase change memory to store a binary 1 (RESET or amorphous state) the common terminal 114 of the access device 110 is pulsed such that a relatively high current signal passes through the memory element 108. A quick power cut-off resulting in an abrupt trailing edge causes the phase change material in the memory element 108 to quench and set in the amorphous state. To store a binary 0 (SET or crystalline state) the current signal at the common terminal 114 of the access device 110 is slowly decreased in amplitude. This results in a gradual trailing edge and the phase change material in the memory element 108 is allowed to slowly cool and set in the crystalline state. By the end of the programming operation, the binary coded word is represented in a particular word 128 as memory cells programmed to high and low resistances.

During a search operation, a coded search word is compared to the coded words stored in memory. If there is a match, the CAM 102 reports the address of the matching code word. The search word is typically received from an external source, such as a central processing unit (CPU) or an external memory controller. The search word is transformed into the coded search word the same way the data word is transformed into a coded word. Each search bit in the coded search word corresponds to a stored bit in the coded word in bit-by-bit sequential order.

The biasing circuit 124 biases the access device 110 to an effective resistance that is complementary to the resistance associated with the bit during memory programming. For example, if the search bit is a binary 1 (high resistance memory) then the effective resistance of the access device 110 is set to a low resistance. If the search bit is a binary 0 (low resistance in memory) then the effective resistance of the access device 110 is set to a high resistance.

The match circuit 120 then measures the collective resistance between the bit line 112 and the match line 106 for each word 128. The search current passes through each memory element 108 and each access device 110. Thus, the collective resistance of the memory elements 108 and the access devices 110 can be measured. Those skilled in the art will recognize that a variety of techniques and circuits may be utilized for resistance measurement, such as, but not limited to, current measurement circuits and resistance controlled oscillators.

Table 1 lists match resistances for one embodiment of the invention is shown. The table is a truth table for access device resistance, memory element resistance, and match line values during a memory search operation. Note that the resistances "L" and "H" are representative of high and low resistance values in the memory elements and access devices. For simplicity, the access devices 110 and memory elements 104 are assumed to use the same complementary resistances, however, this is not a requirement of the invention. In other words, "L" and "H" resistances for the memory elements 104 may be, for example, 5K ohms and 500K ohms respectively, while the "L" and "H" resistances for the access devices 110 may be, for example, 2K ohms and 200K ohms respectively. In a particular configuration of the invention, the high resistance state is at least one order of magnitude larger than the low resistance state.

TABLE 1

Match Resistances

| Access Device Resistance | Memory Element Resistance | Match line Value |
|---|---|---|
| L | H | Match |
| H | L | Match |
| H | H | No match |
| L | L | No match |

Consider, for example, that the resistance for a "H" binary value is k times larger than the resistance for a "L" binary value. If the access transistor resistance is the complementary value of the memory element resistance (a match), then the total resistance across the memory element 104 will be k+1. Furthermore, if all memory elements 104 in a stored word 128 match the searched code, the total resistance measured by the match circuit 120 will be (k+1)/n, where n is the number of bits in the word.

On the other hand, a non-match situation occurs when the access transistor resistance and the memory element resistance in a memory cell 104 are either both high or low. If a word contains exactly one non-matching memory cell and this non-matching memory cell has a high resistance path (i.e., a "H"-"H" resistance pair), the total resistance measured by the match circuit 120 will be higher than the match resistance of (k+1)/n.

If a word contains one non-matching memory cell having low resistance path (i.e., a "L"-"L" resistance pair), the total resistance measured by the match circuit 120 will be less than 2/n. An aspect of the present invention are coding techniques for stored words and search words to guarantee the occurrences of at least one low resistance path when a stored word does not match the search word. In other words, during the search operation, a match current passing through each of the memory cells 104 is within one of two current ranges: a high current range and a low current range. The border between the high current range and the low current range is given by a suitable chosen number between V(k+1)−1, and V(2)−1, where V denotes the voltage applied in the bit line 112. The code word is configured to guarantee that the match current passing through at least one of the memory cells is within a highest possible current range (equal or larger than (2)−1) if the data word does not match the search word during the search operation.

As will be discussed in more detail below, the match circuit 120 is configured to detect a search mismatch by examining the collective current in the match line 106. In a particular embodiment, the match circuit 120 is configured to indicate a memory location if the data word at the location matches the search word. For example, the match circuit 120 returns a memory address if the collective resistance of its memory elements are above a threshold value during a search operation.

Figure 2:
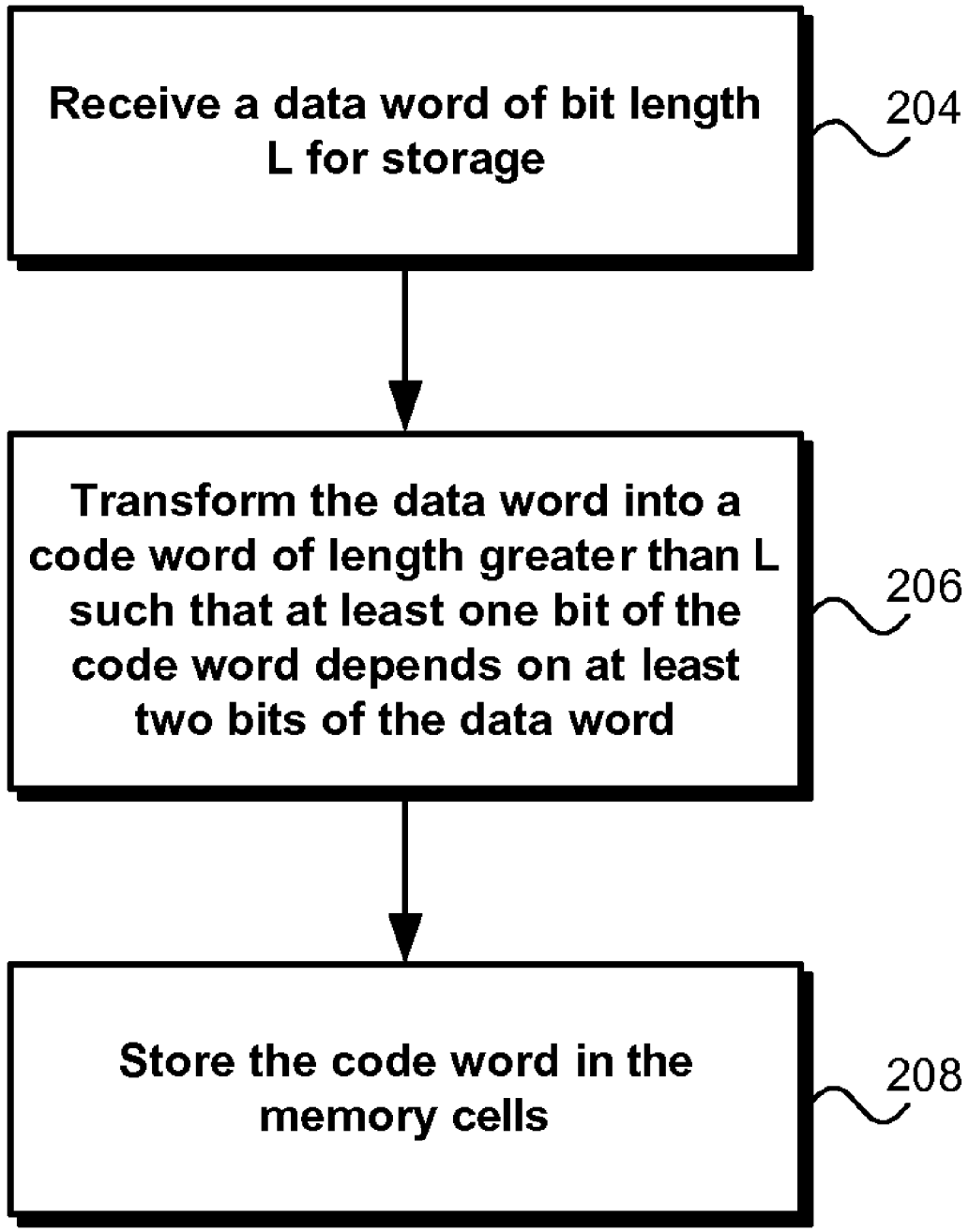
FIG. 2 shows a flowchart of an example programming process for a CAM contemplated by the present invention.

Turing now to FIG. 2, one example of a process for encoding a data word into a code word by the CAM is shown. The operations depicted in FIG. 2 can be implemented in software, firmware, hardware or some combination thereof. Program code logic may be stored in a storage medium, loaded into and/or executed by a computer, wherein, when the program code logic is loaded into and executed by a computer, the computer becomes an apparatus for practicing the invention. Examples of storage medium include solid-state memory (RAM or ROM), floppy diskettes, CD-ROMs, hard drives, universal serial bus (USB) flash drives, or any other computer-readable storage medium.

The process begins with receiving operation 204. During this operation, a data word of bit length L is received by a CAM's receiving unit from an external source, such as a CPU or an external memory controller. Typically, the CAM is connected to a data bus supplying the data word. Once the data word is received, it can be latched in an L-bit buffer for additional processing. After the receiving operation is completed, control passes to transforming operation 206.

At transforming operation 206, an encoding unit transforms the data word into a code word for storage in the CAM. The code word is longer in bit length than the data word, and it may or may not include the data word bits copied verbatim. The transformation is such that at least one of the code word bits depends on at least two of the data bits. This transformation may be seen as a function that maps the data word bits to the code word bits. We say that a bit of the code word depends on at least of two bits of the data word if the value of the bit of the code word cannot be computed as a function of only one data word bit. In one embodiment of invention, the code word guarantees a mismatch of at least two code word bits of different binary values during the memory search operation when the data word does not match a search word. Such a configuration ensures a low resistance path is created between the match line and bit line for the mismatched word.

In a particular embodiment of the invention, the code word is determined from a set of code words having a constant Hamming weight (also referred to as a constant weight code). Hamming weight refers to the number of ones in the code. For example, consider a code word set {011,101,110} to represent three possible values. Each code word in the set has exactly two ones. Therefore, the set of code words have a constant Hamming weight of two. By using constant Hamming weight codes for both data words and search words, a mismatch of at least two code word bits of different binary values during the memory search operation always occurs when the data word does not match a search word. It is noted that implementing a set of encoded numbers having a constant Hamming weight in the CAM may be achieved, for example, using lookup tables and other techniques known to those skilled in art. See, for example, Thomas Cover, "Enumerative source encoding", IEEE Transactions on Information Theory 19:73-77 (1973),incorporated herein by reference.

In yet another embodiment of the invention, the code word includes the data word and a count of ones in the data word using a set of encoded numbers having a constant Hamming weight. Suppose we are trying to store a data word of 63 bits. A constant-weight code of 8 bits with Hamming weight of 4 can enumerate a maximum of 70 distinct possibilities, and only 64 distinct possibilities exist for the number of ones in a 63 bit word. Thus, terminating the data word using a coded ones count of 8 bits with a constant weight of 4 results in code word with a total of 63+8=71 bits. A possible variant of this aspect of the invention is to count the number of zeros instead of the number of ones.

In a further embodiment of the invention, the code word includes the data word and a count of the binary values in the data word that are equal to zero. Assume that L is the number of bits in a data word. A total of ceil(log 2(L+1)) bits are necessary to describe the count which is in the integer range [0,1, . . . ,L]. The count is encoded using the standard binary numeral system; for example if L=7 a total of 3 bits suffice to describe the count of zeros. If 0011000 is the data word then the code word would be 0011000101. Using this coding technique, the code word has a length of L+ceil(log 2(L+1)). A variant of this technique is to count the number of ones and store the bitwise complement of the resulting count.

In another embodiment of the invention, the code word includes the data word, a count of the number of ones in the data word, and bitwise complement of the ones count. For example, suppose we want to store the L-bit data word:

b0 b1 b2 . . . bL−1. The number of ones in the data word is counted and encoded using a binary number system. This number can span from 0 to L, thereby providing L+1 possible outcomes. Including this count as a binary count in the code word results in:

b0 b1 b2 . . . bL−1 c0 . . . ct−1, where t=ceil(log 2(L+1)). Next, a binary NOT operation is performed on c0 . . . c−1, resulting in the code word:

b0 b1 b2 . . . bL−1 c0 . . . ct−1 1−c0 . . . 1−ct−1. Thus, to encode an L-bit data word, the code word in this embodiment has a bit length of L+2*ceil(log 2(L+1)). Suppose, for example, we are trying to store data word of 63 bits. The code word construction requires a total of 63+6+6=75 bits.

Alternatively, we can count the number of ones instead of the number of zeros and proceed as described above.

Those skilled in the art will recognize that similar encoding results can be achieved if we assign the low resistance value of the memory element to a binary "1" instead of a binary "0", and the high resistance value of the memory element to a binary "1" instead of a binary "0". Encoding techniques disclosed herein encompass first and second binary values in general rather than particular numbers for the binary values.

In a further embodiment of the invention, the code word is configured to increase the current passing through the match line during the memory search operation when the data word does not match a search word. For example, the code word may include the data word and one or more parity bits. This configuration may not guarantee a low resistance path during a search mismatch, but it does help advantageously increase the sense margin between matches and mismatches during the search operation.

After the transforming operation 206 has completed, control passes to storing operation 208. During the storing operation, the code word is stored in the CAM memory array. As mentioned above, various resistive memory technologies may be used to store the code word, such as Phase Change Memory (PCM), floating gate transistors, resistive memory elements, Magnetoresistive Random Access Memory (MRAM), and charge trapping devices.

Once stored in the memory array, the code word can be compared against a search code during a memory search operation. As described in detail below, search code is generated from a received search word in a similar fashion to generating the code word from the data word. The search operation outputs a memory location of a stored data word matching the search word.

Figure 3:
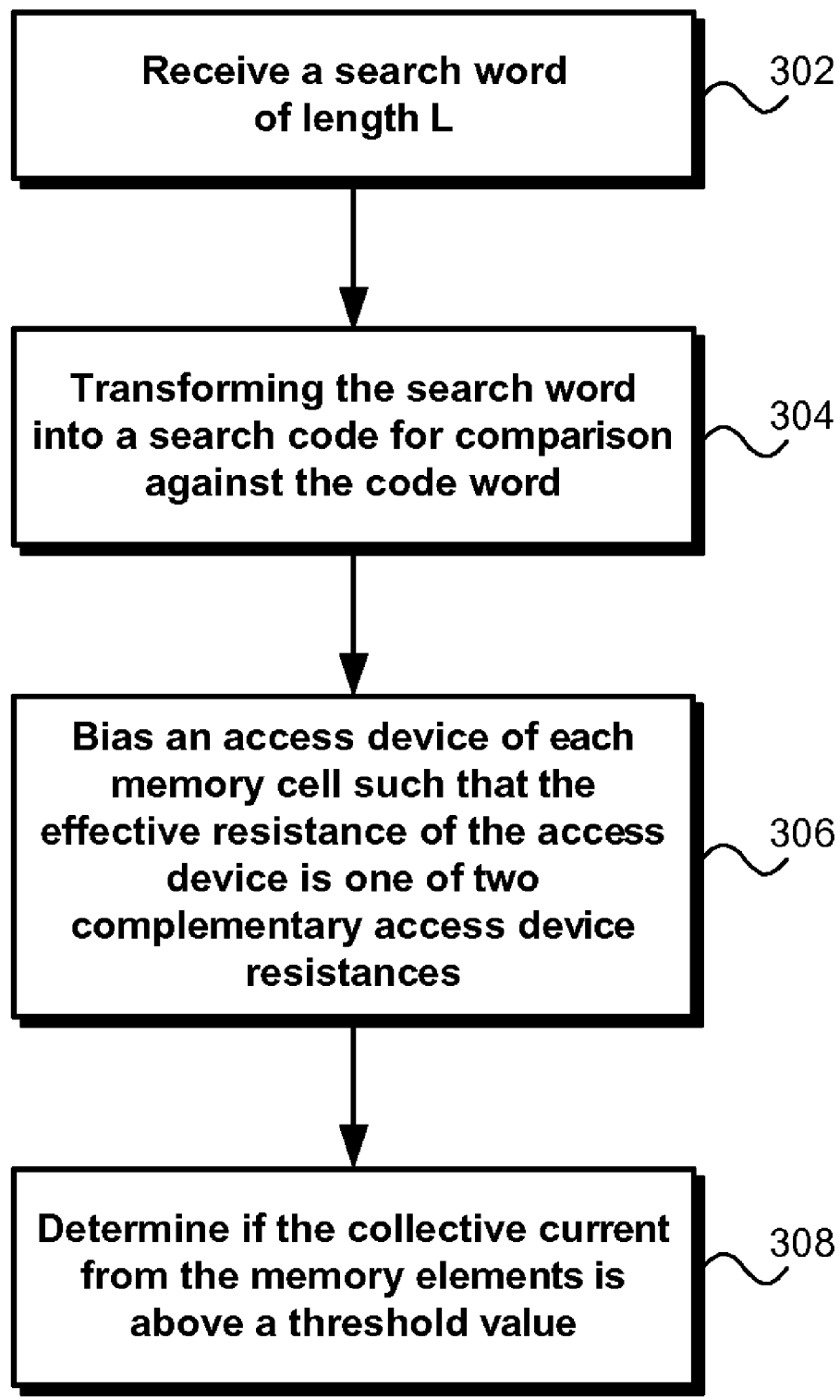
FIG. 3 shows a flowchart of an example search process of a CAM contemplated by the present invention.

FIG. 3 illustrates an example sequence of steps performed during a memory search operation. The operation beings with receiving step 302. During this step, a search word of bit length L is received by a CAM's receiving unit from an external source, such as a CPU or an external memory controller. Once the search word is received, it can be latched in an L-bit buffer for additional processing. After the receiving step is completed, control passes to transforming step 304.

At transforming step 304, an encoding unit transforms the search word into a search code for comparison against the stored code words in the CAM. As with the code word, the search code is of bit length greater than L, and is encoded in the same manner as the code word. Each search bit in the search code corresponds to a stored bit in the code word. Furthermore, the same coding algorithm used to generate the code word is used to create the search code.

Thus, in one embodiment of invention, the search code is determined from a set of search codes having a constant Hamming weight. In another embodiment, the search code includes the search word and a count of ones in the search word using a set of encoded numbers having a constant Hamming weight. In yet another embodiment of the invention, the search code includes the search word and a count of the number of zeros in a search word or alternatively the bitwise complement of the count of the number of ones. In a further embodiment, the search code includes the search word, a count of the number of ones in the search word, and bitwise complement of the ones count. In another embodiment of the invention, the search code includes the search word and one or more parity bits.

After the transforming step 304 has completed, control passes to biasing step 306. During the biasing step 306, the access device of each memory cell is biased such that the effective resistance of the access device is set to either a high or low effective resistance, depending on the value of the corresponding search code bit of the memory cell. In one embodiment of the invention, controlling the effective resistance of the access device is achieved by controlling the bias voltage at the common terminal of the access device.

It is important to note that for a particular binary value, the relative resistances at the memory element and access device are inverse to each other. For example, if a low stored resistance (i.e., 5k ohms) is assigned to the binary 0 value, a high effective resistance (i.e., 500K ohms) is assigned to the same binary value. However, this requirement can be removed if, during the transforming step 304, the search code is inverted.

Once the biasing step 306 is completed, control passes to the determining step 308. During this step, each match unit receives a collective current from an associated match line. The match unit is configured to determine if the collective current from the memory elements is below a threshold value during the search operation.

If the collective current is below the threshold current value, this indicates that a low resistance path between the bit line and match line was not created during the search operation. This, in turn, indicates that the data word and search word match. Thus, the determining step 308 indicates the memory location of the memory elements whose collective current is below the threshold current value during the search operation.

In an alternative embodiment of the invention, the collective resistance of the memory elements coupled to the match line is determined in the determining step 308. If the collective current is above a threshold resistance value, the memory location of the memory elements is output by the CAM.

In another embodiment of the invention, the determining step 308 checks whether the collective current or resistance of each memory word falls within a predetermined value range. This embodiment is useful when the code word does not guarantee a low resistance path when the data word and search word mismatch, but increases the sense margin of the CAM during the search operation.

Figure 4:
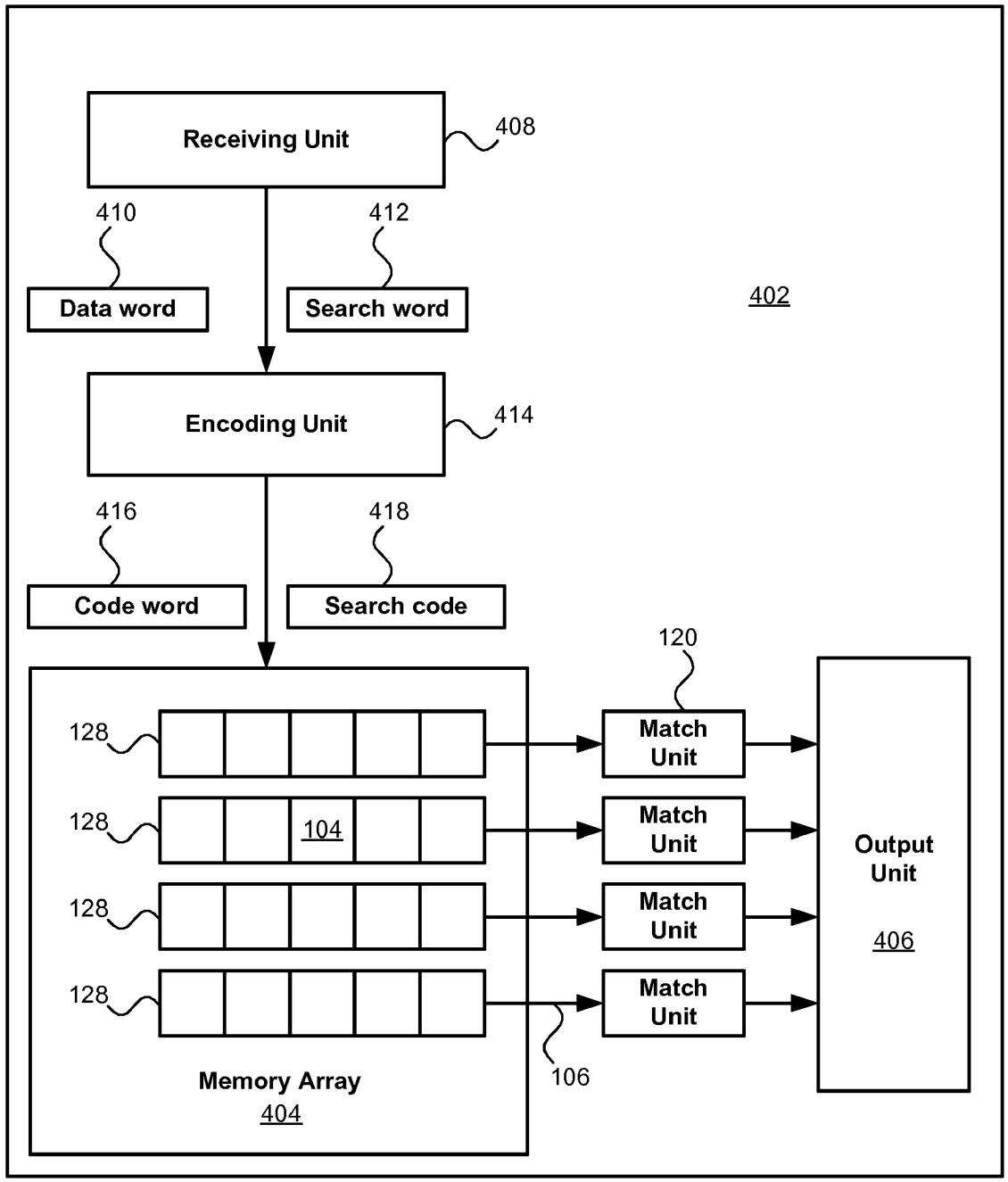
FIG. 4 illustrates another embodiment of a CAM device contemplated by the present invention.

Turning now to FIG. 4, another embodiment of a CAM device 402 contemplated by the present invention is shown. The CAM device 402 includes a memory array 404 for storage and search of a plurality of memory words 128. As described above, each memory word 128 includes a plurality of memory cells 104 electrically coupled to a match line 106.

The match line 106 is configured to receive a collective current from the memory cells 104 during a search operation. The match line 106 is further electrically coupled to a match unit 120 configured to measure if the collective current from the memory cells 104 is below a threshold value during the search operation. Various circuits known in the art may be employed by the match unit 120 to detect a threshold current. For example, a current controlled oscillator and a frequency counter may be used in the match unit 120.

If a match unit 120 signals that the collective current of memory word 128 is below a threshold value during the search operation, an output unit 406 provides the memory location of the memory word 128. In a particular embodiment of the invention, the output unit may include a flag indicating more than one matching memory word 128 is present and allow the multiple addresses of matching memory words to be retrieved from the CAM device 402.

The CAM device 402 also includes a receiving unit 408 configured to receive a data word 410 of length L for storage in the memory array 404. The receiving unit 408 is further configured to receive the search word 412 of length L for comparison against the data word 410 during the search operation. Once the receiving unit 408 latches either the received data word 410 or search word 412, the word is passed to an encoding unit 414.

The encoding unit 414 is configured to transform the data word 410 into a code word 416 of length greater than L for storage in the memory cells 104. As discussed above, the code word 416 is designed to guarantee a mismatch of at least two code word bits of different binary values during the memory search operation when the data word 410 does not match the search word 412.

Various encoding schemes have been discussed herein for achieving this objective. The encoding schemes include creating a code word 416 from a set of code words having a constant Hamming weight, including a count of ones in the data word 410 using a set of encoded numbers having a constant Hamming weight along with the data word 410, including a count of the number of zeros in the data word 410 and finally, including a count of ones in the data word 410 and a bitwise complement of the ones count along with the data word 410. It may be appreciated that in all the encoding techniques discussed at least one of the code word bits depends on at least two of the data bits. Furthermore, those skilled in the art will recognize that these codes ensure that whenever a data word does not match with a search word, the data code word has at least two bits of differing value that mismatch with the corresponding bits in the search code.

The encoding unit 414 is further configured to transform the search word 412 into a search code 418 for comparison against the code word 416 during the search operation. The same coding algorithm used to generate the code word 416 is used to create the search code 418, and the resulting search code bit length is the same as the code word bit length.

In other embodiments of the invention, the encoding unit 414 is configured to transform the search word 412 into a search code 418, such that the Hamming distance between the code word 416 and the search code 418 is greater than a given threshold when there is a mismatch of at least one bit between the data word 410 and the search word 412. This can be ensured if the code is chosen from one of a known family of codes such as linear codes, Hamming codes, BCH codes, etc. In this embodiment, the current passing through the match unit 106 when the code word 416 and the search code 418 do not match may be above or below the match current and therefore to detect a match we need to detect whether the current lies in a given range.

In some applications, ensuring at least one low resistance path may not be sufficient to allow an accurate discrimination between a match and a mismatch condition. A possibility is to utilize a code that ensures at least a number "d" of low resistance paths whenever a data word does not match a search word, where d is a positive integer. One way of ensuring this is by choosing the code words (and hence the search words), from a set of binary vectors having the following properties: 1) the binary vectors have the same Hamming weight (so that the set forms a constant weight code), and 2) the binary vectors have a Hamming distance that is at least 2d. An association between data words and code words in the set described above can be done in any manner convenient to the practical implementation of the encoder, one possible implementation being a table lookup. Those skilled in the art will recognize that these two conditions imply the desired property that if a data word does not match with a search word, then the code word associated with the data word and the search code associated with the search word will be such that at least d low resistance paths will exist, and hence the mismatch current will be correspondingly higher.

Other codes that have a similar effect exist, including codes that append bits to a data word. Suitable codes may be borrowed from code design theory for correcting errors and detect unidirectional errors. As used herein, unidirectional errors are errors in which a first binary value is known to be subject to potential errors converting it to a second binary value, but the second binary value will never be converted to the first binary value. This problem is entirely different from the one solved by embodiments of the present invention, yet codes for this problem may be used in the context of content addressable memories to create at least d low resistance paths. Information about implementing such codes can be found in M. Blaum, *Codes for Detecting and Correcting Unidirectional Errors*, IEEE Computer Soc. Press, Los Alamitos, Calif., (1993), incorporated herein by reference in its entirety. It is noted that codes that ensure at least d low resistance paths when a search word mismatches with a stored word requires code words with increasing amounts of bits as the parameter d increases while maintaining the number of data word bits constant.

Another aspect of the invention is directed to embodiments that can be embodied in the form of computer-implemented processes and apparatuses for practicing those processes, which is now described with reference to FIG. 5. For example, the computer implemented operations for operating content addressable computer memory are embodied in computer program code executed by computer processors.

Figure 5:
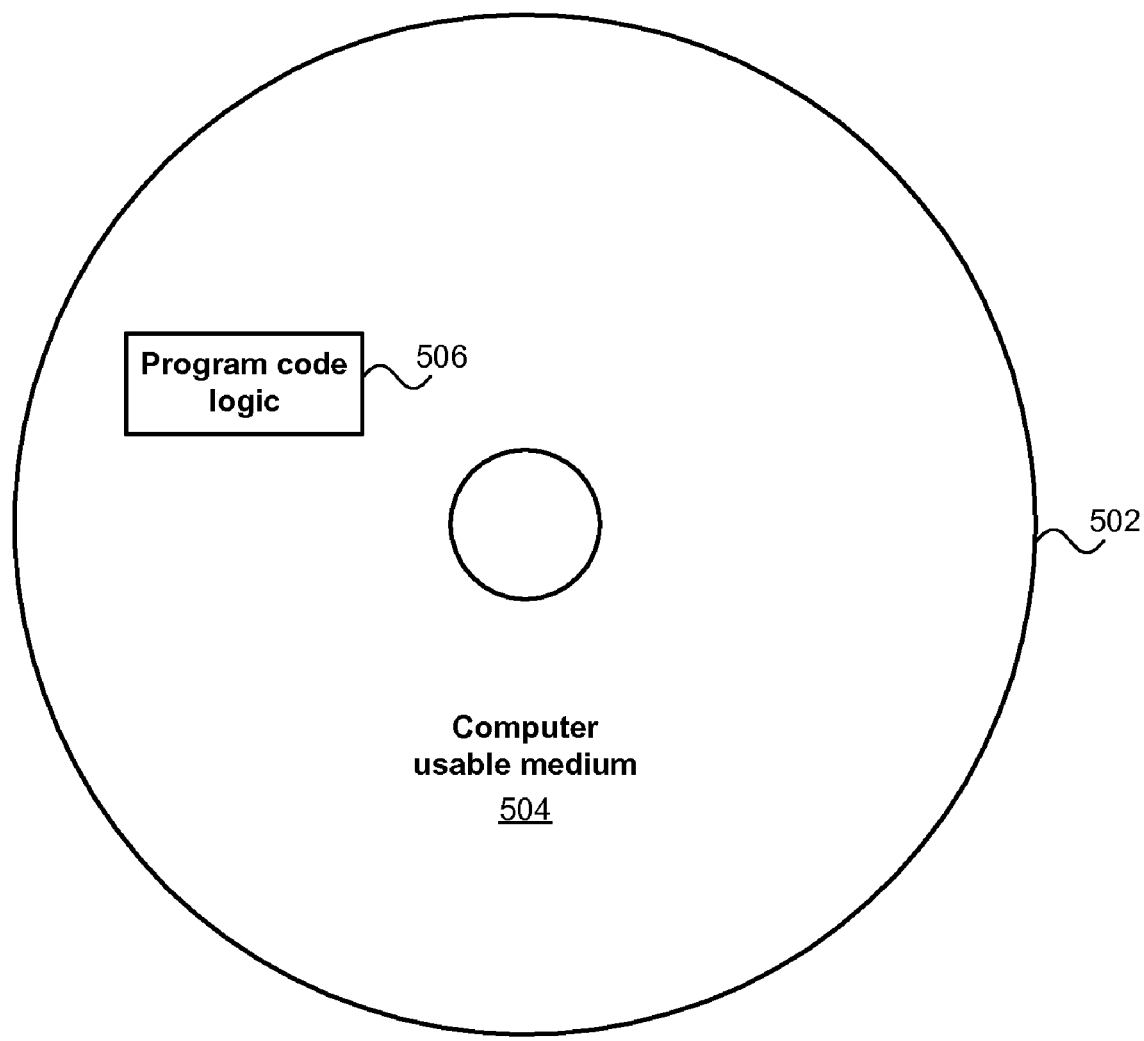
FIG. 5 depicts one embodiment of an article of manufacture incorporating one or more aspects of the invention.

Embodiments include a computer program product 502 as depicted in FIG. 5 on a computer usable medium 504 with computer program code logic 506 containing instructions embodied in tangible media as an article of manufacture. Example articles of manufacture for computer usable medium 504 may include floppy diskettes, CD-ROMs, hard drives, universal serial bus (USB) flash drives, or any other computer-readable storage medium, wherein, when the computer program code logic 506 is loaded into and executed by a computer, the computer becomes an apparatus for practicing the invention.

Embodiments include computer program code logic 506, for example, whether stored in a storage medium, loaded into and/or executed by a computer, wherein, when the computer program code logic 506 is loaded into and executed by a computer, the computer becomes an apparatus for practicing the invention. When implemented on a general-purpose microprocessor, the computer program codes configure the microprocessor to create specific logic circuits.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to embodiments thereof, it will be apparent that modifications and variations are possible without departing from the scope of the invention defined in the appended claims.

What is claimed is:

1. A method for operating content addressable memory, the method comprising:
   providing a plurality of memory cells in parallel circuit, the memory cells being electrically coupled to a match line, the match line configured to receive a collective current from the memory cells during a memory search operation;
   receiving a data word of bit length L for storage in the memory cells;
   transforming the data word into a code word of bit length greater than L such that at least one code word bit in the code word depends on at least two data word bits in the data word, the code word guaranteeing a mismatch of at least two code word bits of different binary values during the memory search operation when the data word does not match a search word; and
   storing the code word in the memory cells.

2. The method of claim 1, wherein the code word is determined from a set of code words having a constant Hamming weight.

3. The method of claim 1, wherein the code word includes the data word and a count of the number of zeros in the data word, the count encoded using a binary numeral system.

4. The method of claim 1, further comprising:
   wherein the data word includes a plurality of digits represented as a first binary value and a second binary value; and
   wherein the code word includes the data word and an encoded number of occurrences of the first binary value in the data word, the encoded number of occurrences of the first binary value is determined from a set of encoded numbers having a constant Hamming weight.

5. The method of claim 1, further comprising:
   wherein the data word includes a plurality of digits represented as a first binary value and a second binary value; and
   wherein the code word includes the data word, an encoded number of occurrences of the first binary value in the data word, and a bitwise complement of the encoded number of occurrences of the first binary value in the data word.

6. The method of claim 1, further comprising:
   creating at least d low resistance paths along the parallel circuit, where d is an positive integer.

7. The method of claim 6, wherein the code word is selected from a set of binary vectors with the same Hamming weight, the binary vectors having a Hamming distance that is at least 2d.

8. The method of claim 1,
   wherein the code word is configured to guarantee that the match current passing through at least one of the memory cells during the search operation is within a highest possible current range of at least two current ranges if the data word does not match the search word during the memory search operation.

9. The method of claim 1, further comprising:
receiving at the content addressable memory the search word of length L for comparison against the data word during the search operation;
transforming at the content addressable memory the search word into a search code for comparison against the code word during the search operation; and
determining if the collective current from the memory cells is below a threshold value during the memory search operation.

10. The method of claim 9, further comprising:
wherein each memory cell includes a memory element electrically coupled to an access device in series circuit, the memory element configured to store binary data as one of two complementary memory element resistances; and
biasing the access device of each memory cell such that the effective resistance of the access device is one of two complementary access device resistances during the memory search operation.

11. A method for operating content addressable memory, the method comprising:
providing a plurality of memory cells in parallel circuit, the memory cells being electrically coupled to a match line, the match line configured to receive a collective current from the memory cells during a memory search operation;
receiving a data word of bit length L for storage in the memory cells;
transforming the data word into a code word of bit length M, where M is greater than L, such that at least one code word bit depends on at least two data word bits;
storing the code word in the memory cells;
receiving a search word of bit length L for comparison against the data word during the memory search operation;
transforming the search word into a search code of bit length M such that the Hamming distance between the code word and the search code is greater than a hamming threshold when there is a mismatch of at least one bit between the data word and the search word; and
indicating a match if the collective current is above a bottom current threshold and below a top current threshold.

12. A content addressable memory device comprising:
a plurality of memory cells in parallel circuit, the memory cells being electrically coupled to a match line, the match line configured to receive a collective current from the memory cells during a memory search operation;
a receiving unit configured to receive a data word of length L; and
an encoding unit configured to transform the data word into a code word of length greater than L for storage in the memory cells, wherein at least one of the code word bits depends on at least two of the data word bits, the code word guaranteeing a mismatch of at least two code word bits of different binary values during the memory search operation when the data word does not match a search word.

13. The content addressable memory device of claim 12, wherein code word is selected from a set of code words having a constant Hamming weight.

14. The content addressable memory device of claim 12, further comprising:
wherein the data word includes a plurality of digits represented as a first binary value and a second binary value; and
wherein the code word includes the data word and an encoded number of occurrences of the first binary value in the data word, the encoded number of occurrences of the first binary value is determined from a set of encoded numbers having a constant Hamming weight.

15. The content addressable memory device of claim 12, further comprising:
wherein the data word includes a plurality of digits represented as a first binary value and a second binary value; and
wherein the code word includes the data word, an encoded number of occurrences of the first binary value in the data word, and a bitwise complement of the encoded number of occurrences of the first binary value in the data word.

16. The content addressable memory device of claim 12, wherein the encoding unit ensures that when the data word does not match the search word during the search operation, at least d low resistance paths along the parallel circuit are created.

17. The content addressable memory device of claim 16, wherein the code word is selected from a set of binary vectors with the same Hamming weight, the binary vectors having a Hamming distance that is at least 2d.

18. The device of claim 12, wherein the code word includes the data word and a count of the number of zeros in the data word, the count encoded using a binary numeral system.

19. The content addressable memory device of claim 12, further comprising:
wherein the receiving unit is further configured to receive the search word of length L for comparison against the data word during the search operation;
wherein the encoding unit is further configured to transform the search word into a search code for comparison against the code word during the search operation; and
a match unit configured to measure if the collective current from the memory cells is below a threshold value during the search operation.

20. The content addressable memory device of claim 19, further comprising:
wherein each memory cell includes a memory element electrically coupled to an access device in series circuit, the memory element configured to store binary data as one of two complementary resistances; and
a biasing unit configured to bias the access device of each memory cell such that the effective resistance of the access device is one of two device resistances during the search operation.

21. The content addressable memory device of claim 20, wherein the access devices are electrically coupled to search lines such that a plurality of the access devices are electrically coupled to a single search line.

22. The content addressable memory device of claim 19, wherein the match unit is further configured to indicate a memory location of the memory cells if the collective current is below the threshold value during the search operation.

23. The content addressable memory device of claim 12, wherein the code word is configured to guarantee that the match current passing through at least one of the memory cells during the search operation is within a highest possible current range of at least two current ranges during the search operation if the data word does not match the search word.

24. A content addressable memory device comprising:
a plurality of memory cells in parallel circuit, the memory cells being electrically coupled to a match line, the match line configured to receive a collective current from the memory cells during a memory search operation;

a receiving unit configured to receive a data word of length L; and an encoding unit configured to transform the data word into a code word of length greater than L for storage in the memory cells, wherein at least one code word bit depends on at least two data word bits, the code word is configured to increase the current passing through the match line during the memory search operation when the data word does not match a search word.

25. A computer program embodied in computer readable memory comprising:

program codes coupled to the computer readable memory for operating computer memory, the computer memory including a plurality of memory cells in parallel circuit, the memory cells being electrically coupled to a match line, the match line configured to receive a collective current from the memory cells during a memory search operation, the computer codes configured to cause the computer program to:

receive a data word of bit length L for storage in the memory cells;

transform the data word into a code word of length greater than L, wherein at least one bit of the code word depends on at least two bits of the data word, the code word guaranteeing a mismatch of at least two code word bits of different binary values during the memory search operation when the data word does not match a search word; and store the code word in the memory cells.

* * * * *